(12) United States Patent
Bangert et al.

(10) Patent No.: US 7,933,144 B2
(45) Date of Patent: Apr. 26, 2011

(54) COMPONENT WITH A LOGIC CIRCUIT ARRANGEMENT WITH CONFIGURABLE FUNCTIONALITY

(75) Inventors: Joachim Bangert, Erlangen (DE); Christian Siemers, Wolfsburg (DE)

(73) Assignee: Siemens Aktiengesellschaft, Munich (DE)

( * ) Notice: Subject to any disclaimer, the term of this patent is extended or adjusted under 35 U.S.C. 154(b) by 1158 days.

(21) Appl. No.: 10/552,657

(22) PCT Filed: Mar. 24, 2004

(86) PCT No.: PCT/EP2004/003134
§ 371 (c)(1), (2), (4) Date: Dec. 21, 2006

(87) PCT Pub. No.: WO2004/100170
PCT Pub. Date: Nov. 18, 2004

(65) Prior Publication Data
US 2007/0164781 A1 Jul. 19, 2007

(30) Foreign Application Priority Data
May 8, 2003 (DE) .................. 103 20 701

(51) Int. Cl.
*G11C 11/00* (2006.01)
(52) U.S. Cl. .................. 365/158; 365/171; 365/173
(58) Field of Classification Search .......... 365/158, 365/171, 173
See application file for complete search history.

(56) References Cited

U.S. PATENT DOCUMENTS

| 3,700,311 | A | 10/1972 | Shoemaker |
| 5,469,299 | A | 11/1995 | Nagano |
| 5,949,250 | A | 9/1999 | Schmidt et al. |
| 6,542,000 | B1 | 4/2003 | Black et al. |
| 6,552,926 | B2 * | 4/2003 | Komori .................. 365/158 |
| 6,667,526 | B2 * | 12/2003 | Komori .................. 257/421 |
| 6,791,876 | B2 * | 9/2004 | Tanizaki et al. ......... 365/171 |
| 2004/0252380 | A1 | 12/2004 | Kashima |

FOREIGN PATENT DOCUMENTS

| DE | 100 53 206 | 1/2002 |
| DE | 101 44 395 | 10/2002 |
| DE | 101 44 384 | 1/2003 |
| DE | 103 35 065 | 7/2004 |
| EP | 1 471 643 | 10/2004 |
| WO | WO 03/026131 | 3/2003 |
| WO | 03056379 | 7/2003 |
| WO | 2004065994 | 8/2004 |

OTHER PUBLICATIONS

International Search Report and French Search Report.
Andrew R. Rouse et al., "Design and demonstration of a miniature catheter for a confocal microendoscope", Applied Optics, Nov. 2004, V43, No. 31, pp. 5763-5771.
Lowrey, Tyler: "OUM—Ovonic Unified Memory" Online!, December 1999, OVONYX, XP002296442, Retrieved from the Internaet:, URL: http://WWW.ovonyx.com/technology.pdf>'retrieved on Sep. 10, 2004!, pp. 5, 20, 28-pp. 34, 58-63 , p. 78.

\* cited by examiner

*Primary Examiner* — Pho M Luu
(74) *Attorney, Agent, or Firm* — Young & Thompson

(57) ABSTRACT

A component with a logic circuit arrangement with configurable functionality, includes several data lines (7), whereby at least a part of the data lines (7) is provided with at least one element (1) which may be switched between two states with different discrete resistances. The data line (7) is opened or closed by the element (1), depending on the switched state.

18 Claims, 2 Drawing Sheets

COMPONENT WITH A LOGIC CIRCUIT ARRANGEMENT WITH CONFIGURABLE FUNCTIONALITY

Figure 1:
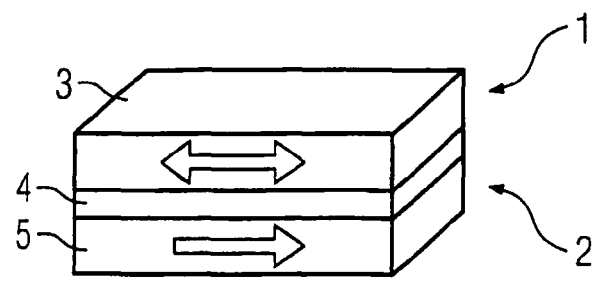

The invention relates to a component with a logic circuit arrangement with configurable functionality, comprising a plurality of data lines.

Configurable components have been known for a long time; since they preferably execute logic functions they are generally referred to as programmable logic device (PLD). Such PLD components are principally used for less complex tasks. Such logic modules are disclosed e.g. in U.S. Pat. No. 4,870,302 or the publication "Ranmuthu, I. W. et al.; Magneto-resistive elements—An Alternative to Floating Gate Technology; In: Proceedings of the Midwest Symposiums on Circuits and Systems, 1992, pg(s). 134-136 vol. 1". The application program is defined during booting in the case of such logic modules: a program is read from a program memory and configurable regions are configured. The configurable regions have the following properties: either they define linkages between predetermined points (routing regions) or they define the processing of logic input signals to form logic output signals (logic cell regions).

The programming information is thus distributed in terms of area. The configurability of the PLDs is restricted to a small number of configurable parameters that are fixed set during booting. Two memories are required in this case: an external boot memory chip (discrete chip, e.g. an EEPROM 113 in U.S. Pat. No. 4,870,302) and internal, aerially distributed memory cells (e.g. according to FIGS. 3a and 10a in U.S. Pat. No. 4,870,302 or FIG. 5 in the publication by Ranmuthu et al.). After booting, the local memory cells contain the information items for the linkages and for the logic functions of the cells.

Essential parameters for assessing the performance of these memories are the area requirement and the static (leakage) energy consumption as static "costs" and also the switching speed and capacity as dynamic "costs". Only nonvolatile, reconfigurable architectures, namely SRAM in combination with boot ROM or EEPROM, will be considered below. The SRAM is a relatively large cell, has a fast operating speed and is a volatile memory; by contrast, the boot ROM is slow and nonvolatile. The EEPROM is a medium-size cell having a slow operating speed, high configuration power demand and low "read" power consumption.

The area and power loss efficiency of the distributed memory cells is approximately up to two orders of magnitude worse than that of discrete memory chips of identical performance. If the application program requires less performance than is provided by the chips, however, then the unused regions unavoidably likewise consume power loss. Typical degrees of utilization of the existing logic blocks of PLDs are approximately 30% to 70%. At a specific point in time, only fractions of this are actually actively involved in the processing of logic information items.

A component, in particular in the form of a logic circuit arrangement, is provided with a multiplicity of data lines which link the individual functional elements of the circuit arrangement to one another, that is to say which connect logic cells to one another, define the routing region or determine other signal connections. The data lines thus define the data or signal transfer path, that is to say the linkage between predetermined points and the signal processing. The configured profile of the data lines is thus accorded an important function in the context of the configuration.

The invention is based on the problem of specifying a possibility of being able to influence the profile or state of a data line in the context of the configuration in a simple manner.

This problem is solved by providing a component of the type mentioned in the introduction, at least a portion of the data lines being assigned at least one element that can be switched between two states with different discrete resistances, by means of which element the data line is enabled or inhibited depending on the switched state, it being possible for the switching state of the element to be stored in nonvolatile fashion and to be changed over rapidly.

The component according to the invention uses an element that can be switched in terms of its resistance, the data line either being enabled, that is to say data can be transferred, or else being inhibited, that is to say the data transfer is interrupted, depending on the element's resistance that is respectively set in a manner governed by the circuit. By changing the resistance characteristic of the assigned element, it is thus possible for the data line to be enabled or opened very rapidly.

If the element is arranged in a series circuit, then the data line connecting a source and a part, e.g. a gate, connected downstream of said source is enabled (low resistance) or inhibited (high resistance) by the resistance change of the element. In a parallel circuit where the element is in parallel with the data line, the signal is either short-circuited (low resistance) or the element is not manifested (high resistance), and the signal is passed unhindered via the data line. Finally, there is the possibility of connecting up a series circuit of a component according to the invention with an output transistor as follows: low-resistance behavior means the data line is constant (e.g. positive pole), information is inhibited. If the component is switched at high resistance, it behaves as a pull-up resistor and the source signal passes via the data line.

It is particularly important that the change in resistance can be stored in a suitable manner without any further supply of energy and is thus always available. It would be advantageous for the change to be able to be carried out at any time, without restricting the number of cycles and also at a high speed. The changeover speed should be $\leq 3$ ns.

The element used in accordance with the invention can be an element exhibiting a magnetoresistive effect, preferably a TMR cell (TMR=Tunneling Magnetoresistive). Such magnetoresistive elements are distinguished by the fact that their resistance behavior is determined by the position of the magnetization of a soft-magnetic information layer with respect to a hard-magnetic reference layer. Depending on whether the magnetizations are parallel or antiparallel to one another, a low or high resistance is realized by means of the element. The magnetization direction of the soft-magnetic layer can be changed in a simple and rapid manner, for which purpose use is made of a configuration current pulse which is passed via a configuration conductor and generates a magnetic field acting on the magnetization of the soft-magnetic layer.

As an alternative—or in addition to the use of the magnetoresistive elements—the element may also exhibit a resistance change as a result of a phase change generated during switching, in particular from an amorphous state to a crystalline state. The element is thus designed as a phase change cell, which may also be referred to as an OUM cell (OUM=Ovonic Unified Memory).

A phase change cell based on this effect is a memory whose memory mechanism is based on a reversible structural phase change from an amorphous phase to a crystalline phase. A chalcogenide alloy material in the form of a thin film may be used as phase change material. In the event of a phase change, the resistance changes between two discrete values; that is to say that in this case, too, a change between a high and low resistance occurs during switching. A rapidly programmable resistance memory is thus involved. Phase change systems used may be binary systems (e.g. GaSb, InSb, InSe, $Sb_2Te_3$, GeTe), tertiary systems (e.g. $Ge_2Sb_2Te_5$, InSbTe, GaSeTe, $SnSb_2Te_4$, InSbGe) or quaternary systems (e.g. AgInSbTe, (GeSn)SbTe, GeSb(SeTe), $Te_{81}Ge_{15}Sb_2S_2$), the GeSbTe alloy system preferably being used. While the amorphous phase exhibits a close atomic arrangement, a low density of free electrons, a high activation energy and a high resistance, the conditions of the crystalline phase are exactly the opposite; a longer atomic arrangement, a higher density of free electrons, a lower activation energy and also a lower resistance are established. The switching process can be effected with low switching voltages, a current pulse with a control voltage above the threshold voltage of the cell serving for switching. In this case, too, the cell information is read out by means of the resistance set. A phase change cell is described e.g. on the published website http://www.ovonyx.com/tech_html.html.

What is common to all the elements that can be used is that their resistance can be switched between two discrete values. As a result of the resistance change there is necessarily a change in a current passed via the respective element. According to a first refinement of the invention, it may be provided, then, that a pass transistor (connected into the data line) is inhibited or enabled by means of the element. This pass transistor is switched by means of the element respectively assigned to it. The opening or enabling of the data line is thus controlled indirectly by means of the element which switches the pass transistor connected directly into the data line. The current or aggregate current respectively passed via one element or for example two coupled elements is applied to the gate input of the pass transistor, preferably embodied as an MOS transistor. The pass transistor is activated or inhibited depending on the magnitude of this control voltage. If it is activated, then the data line into which the transistor is connected is enabled. If it is inhibited, the data line is also inhibited at the same time, and information items cannot be transmitted via said data line. In the case where the element is connected in parallel with the data line, it short-circuits the latter in the low-resistance state and it is transparent in the high-resistance state.

In this case, only one element may be provided for actuating the pass transistor, provided that the resistance ratio, that is to say the ratio between the low switchable resistance and the high switchable resistance, is sufficiently high, so that a sufficiently high voltage ratio can be applied to the gate input for controlling the transistor. As an alternative to the use of only one element having a high resistance ratio, it is also conceivable to provide two elements coupled to one another and operated in parallel, by means of which an aggregate voltage can be applied to the gate input. If two TRM cells are used for driving a pass transistor, then they are expediently driven in inverted fashion.

In a development of the concept of the invention, it may be provided that the two elements, in particular the two TMR cells, have a resistance ratio between the two state-related resistances not equal to 1:1, in particular of 1:2 or higher. The higher the resistance ratio, the further the control voltages dependent on the respective resistances are separated from one another.

Besides the possibility of using one or more elements to control a pass transistor for enabling or for inhibiting the data line and to close or open the data line indirectly by means of the element, according to an alternative refinement of the invention, there is also the possibility of an element being connected directly into the data line and directly opening or inhibiting the latter. According to this refinement of the invention, then, such an element is used directly as a pass transistor. A prerequisite for this is that a sufficiently high resistance ratio between the two state-related resistances of at least 1:10 or greater can be realized at the element. In the case of this embodiment, the data line would be enabled given the setting of the low resistance, and it would be inhibited given the setting of the high resistance.

The above explanations hold true analogously for the embodiment as a parallel circuit.

Overall, the component according to the invention affords a series of advantages in comparison with technologies or architectures used heretofore. The customary technologies make use of configuration storage by means of an SRAM memory or an EEPROM memory.

SRAM cells can in principle drive only one pass transistor. The cause of this resides in the operational principle of this cell, which is based on the flip-flop principle. In this case, transistors are mutually coupled in such a way that the circuit knows two stable states and these states are visible externally as voltage. The use of an element according to the invention here lowers the number of transistors per pass element; with the use of two elements for switching a pass transistor, only three units of area are necessary (the two elements and also the pass transistor itself), or only one unit of area is required if an element itself is used as a pass transistor. The area size of a TMR cell is $\leq$ the area size of a transistor. A further advantage can be seen in the maintenance of the configuration upon failure of the supply voltage, which makes an additional boot memory unnecessary. That is to say that it is not necessary to supply energy for permanent storage, in comparison with the SRAM. Very fast changeover times ($\leq$3 ns) can nevertheless be realized, since the resistance can be switched very rapidly.

An EEPROM (including flash) also comprises a plurality of transistors which can be reprogrammed slowly and in a complicated manner and have poor transit times, compared with a simple pass transistor. Moreover, the EEPROM transistors are larger than normal transistors since an additional interconnect is required for the tunnel path. Compared with EEPROM technology, the use of the elements, in particular of the TMR cell, affords the advantage of fast and uncomplicated reprogramming. This advantage is central since dynamically reconfigurable components will be used in the future. This is not conceivable or possible with EEPROM cells, since EEPROM cells exhibit only a slow switching speed of the floating gate in the ps range, but is indeed conceivable and possible with the cells that can be varied in terms of their resistance, in particular in the form of the TMR cells.

Figure 2:
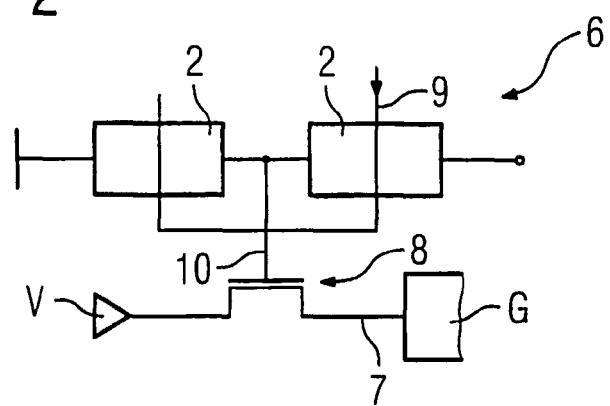
Figure 3:
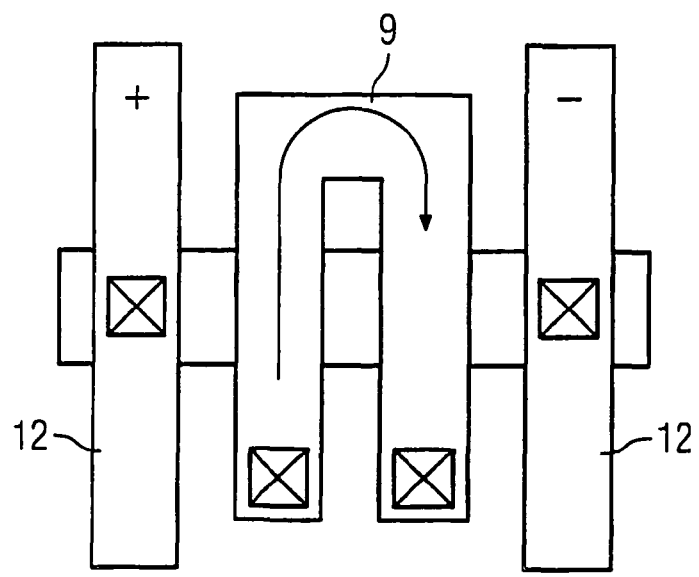
Figure 4:
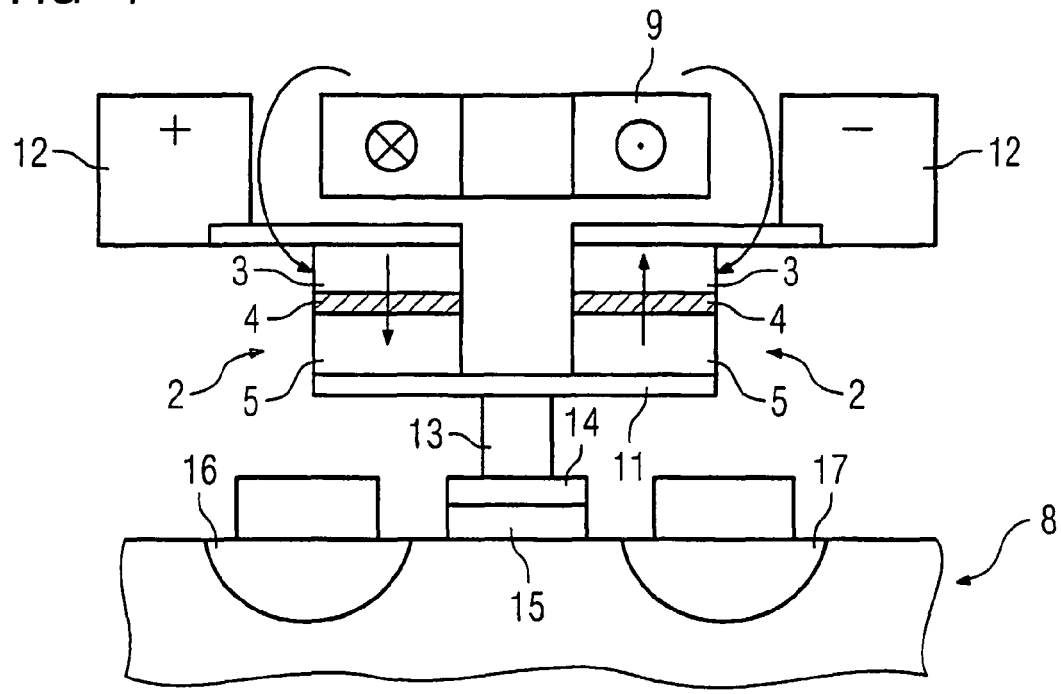
Figure 5:
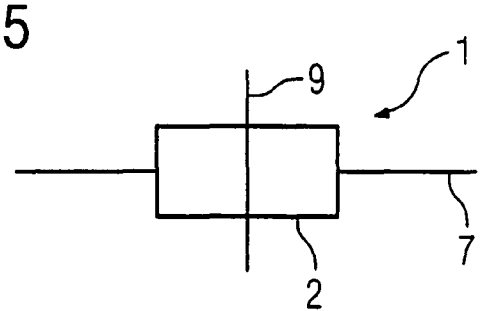
Figure 6:
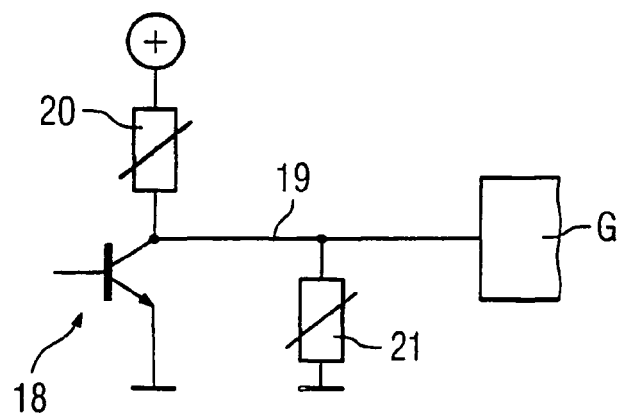

Further advantages, features and details of the invention emerge from the exemplary embodiments described below and also on the basis of the drawings, in which:

FIG. 1 shows a schematic diagram of a layer system of a TMR cell,

FIG. 2 shows a schematic diagram of the connection in series of two elements for controlling a pass transistor, FIG. 3 shows a more comprehensive illustration of the arrangement from FIG. 2, FIG. 4 shows a section through the arrangement from FIG. 3, FIG. 5 shows a schematic diagram of an element that serves as a pass transistor and is arranged directly in the data line, and FIG. 6 shows a schematic diagram of a circuit in which the pass transistor is connected in parallel with the data line.

FIG. 1 shows, in the form of a schematic diagram, an element 1 in the form of a TMR cell 2, comprising a soft-magnetic information layer 3, an electronic barrier layer 4 and a hard-magnetic reference layer 5.

The soft-magnetic layer or a soft-magnetically acting layer bundle that forms said information layer 3 can be subjected to magnetization reversal by currents or current pulses on interconnects, which currents or current pulses generate a magnetic field or a magnetic pulse that acts on the layer magnetization. The coercive field strength (symmetrically with respect to H=0) and a spin polarization and a remanence are typical characteristics. The basic materials are known magnetic materials of low or medium coercive field strength. The double arrow indicates the anisotropy axis in which the magnetization can be established. Two discrete magnetization states can thus be set.

The barrier layer 4 forms an electronic barrier; it arises through an abrupt change in the band structure. This may be achieved by means of material interfaces, but also for example by means of dopings. The electronic barrier enables direct tunneling of charge carriers between the adjoining electrodes. The properties of the electronic barrier determine the "basis resistance" of the elements, and also the voltage dependence of the characteristic curve. A further criterion is the maintenance of the spin polarization during tunneling or a total spin flip (e.g. spin-up becomes spin-down). For the TMR effect, the following insulator materials are often used as barrier materials: $AlO_x$, AlN, $TaO_x$, BN, MgO; semiconducting materials: ZnS, $GaO_x$; further materials: NiO, Nbo, $HfO_2$, $TiO_2$, $SiO_2$, $Fe_2O_3$, $Fe_3O_4$. The material thickness is a few atomic layers up to a few nanometers. Crystalline and amorphous barriers are used.

The reference layer 5 is magnetically hard and can (ideally) not be altered by signals in the chip and external fields. It comprises at least the reference layer or (normally) a complex layer sequence (=layer system) containing the reference layer. What is essential for the TMR cell is that at least one magnetic layer interacts actively with the electrons. This is in each case that layer which adjoins the nonmagnetic intermediate layer. Since it is part of the magnetically hard layer, the magnetization thereof is predetermined and it contains the reference magnetization for the TMR effect (or the GMR effect). Typical magnetic materials are layers having high spin polarization (e.g. CoFe, Py, Fe) and at the same time high exchange interaction with the adjacent layer in the hard layer. In some layer constructions, the hard layer may also have two reference layers, for example in the case of a hard layer in the center of a symmetrical GMR construction.

FIG. 2 shows a detail from a circuit arrangement 6 according to the invention of a component according to the invention, which may be an arbitrary component, primarily a logic circuit arrangement. The figure shows a data line 7, into which a pass transistor 8 is connected in the exemplary embodiment shown, by means of which pass transistor the data line 7, which e.g. interlinks two arbitrary logic elements, e.g. an amplifier V and a gate G or individual logic cells, can be opened or inhibited. For switching the pass transistor 8, two TMR cells 2 are provided, the resistance of which can be set by means of a configuration current which is passed via a configuration current interconnect 9 and generates a corresponding magnetic field. The control voltage that is dropped, due to the resistance, across the two TMR cells 2 (which may also be designated as a twin cell) that are coupled to one another is applied via the connection 10 to the gate input of the pass transistor 8. The pass transistor 8 is either inhibited or activated depending on the magnitude of said control voltage.

FIGS. 3 and 4 show the circuit arrangement 6 from FIG. 2 in detail. The two TMR cells 2 are shown, which are coupled to one another via a coupling line 11 at their output on the reference layer side, by way of example. At the opposite side, each TMR cell 2 is coupled to a pole of a current supply 12, so that overall a current can be passed via the twin cell arrangement. The configuration current conductor 9 is furthermore shown, which is guided such that it becomes reversed above the TMR cells 2. A configuration current can be passed via said configuration current conductor, that is illustrated by the bent arrow in FIG. 3. Since the current direction is opposite on account of the conductor routing above the two TMR cells 2, magnetic fields directed antiparallel are generated, as is illustrated by the two arrows in FIG. 4 around the configuration current conductor 9, that is to say that the two cells are operated antiparallel with respect to one another. Depending on the current direction via the configuration current conductor 9, it is possible to set the direction of the magnetic fields respectively generated and, by means of the latter, the magnetization of the adjacent soft-magnetic layer 3 of the two TMR cells 2. In this way, the respective resistance of a TMR cell can be switched simply between a state-dependent low and high value. Given a resistance ratio of 1:2, this always results in triple the minimum resistance of an element as loading resistance for the supply voltage and also a control voltage value of ⅔ of the supply voltage or, respectively ⅓ of the supply voltage. Given a correspondingly designed threshold voltage of the pass transistor, which is embodied e.g. as a MOS transistor, this voltage ratio suffices to drive the states "transistor turns off" and "transistor turns on". The influence on the data line 7 is produced by the amplifying properties of the transistor as a controlled resistance. If the resistance ratio can be increased, the control voltages are correspondingly separated further from one another. Saturation of the transistor should be avoided, however.

The control voltage generated at the twin cell arrangement is passed via a corresponding connection 13 to the input 14 of the gate 15 of the pass transistor 8. The function of such a transistor is known; the transistor is turned on, that is say it is activated, or it is inhibited depending on the magnitude of the control voltage present at the gate 15. The transistor state can thus be switched in a simple manner by changing the resistance ratios at the twin cell arrangement.

The distance between the two TMR cells 2 is of the same order of magnitude as the gate length (a few 100 nm). Source and drain currents in the source region 16 and drain region 17, respectively, of the pass transistor 8 are negligible in comparison with the configuration currents; therefore, the distance between the two TMR cells 2 and the gate 15 can be determined by the required insulation distances. The construction is consequently very compact. It appears to be expedient to realize large TMR resistances for minimizing the shunt current between the poles of the current supply 12, which is possible by means of a thick barrier layer and a small area.

FIG. 5 shows, in the form of a schematic diagram, an alternative embodiment that is equally useful for enabling or inhibiting the data line 7. In this case, an element 1, a TMR cell 2 in the exemplary embodiment, is connected directly into the data line 7. A prerequisite is that the TMR cell 2 exhibits a high resistance ratio of preferably about 1:10 or more. It can then be used directly as a pass transistor, thereby further reducing the number of the required transistors for switching the data line 7. The data line is opened if a low resistance is set at the TMR cell, which is equally assigned a configuration current conductor 9 in order to be able to switch the resistance of the soft-magnetic layer. It is inhibited if the high resistance is set through corresponding switching of the magnetization of the soft-magnetic layer.

The wiring of the configurable circuit passes through the TMR cell 2. The configuration interconnect 9 is part of the wiring and may run above, below, or in combination both above and below, the TMR cell 2. The connections of the TMR cell may be led into the silicon or remain in the wiring layer.

Finally, FIG. 6 shows a circuit arrangement illustrating a transistor 18 that can be switched by means of two TMR cells (not specifically shown), these TMR cells and the transistor being connected in parallel with the data line 19 to be "switched", which connects a gate G to the positive pole of a voltage supply, that is to say a source, via a pull-up resistor 20. A pull-down resistor 21 is furthermore provided. The gate is or is not connected to the source depending on whether the TMR cells are switched at high resistance or low resistance. If the TMR cells are at high resistance, then they behave in transparent fashion; the transistor does not function as a sink and is likewise transparent. If the TMR cells are at low resistance, the transistor functions as a sink and the gate is not connected to the positive pole.

Even though the above embodiments only describe the use of TMR cells, it is equally conceivable to use other magnetoresistive cells whose resistance can be switched correspondingly, or the phase change cells described.

The invention claimed is:

1. A component with a logic circuit arrangement with configurable functionality, comprising a plurality of data lines (7), at least a portion of the data lines (7) being assigned at least one element (1) that can be switched between two states with different discrete resistances, by means of which element (1) the data line (7) is enabled or inhibited depending on the switched state, it being possible for the switching state of the element (1) to be stored in nonvolatile fashion and to be changed over rapidly, wherein i) the element is connected to a gate of a pass transistor (8), the pass transistor is connected into the data line (7) and is inhibited or enabled by means of the element (1), or ii) the element (1) itself is used as a pass transistor that enables or inhibits the data line (7), with the element (1) connected directly into the data line and directly opening or inhibiting the latter, or iii) the element is connected in parallel with the data line and short-circuits the latter or behaves in transparent fashion.

2. The component as claimed in claim 1, wherein the element (1) is an element exhibiting a magnetoresistive effect.

3. The component as claimed in claim 2, wherein the element (1) is a TMR cell (2).

4. The component as claimed in claim 1, wherein the element (1) exhibits a resistance change as a result of a phase change generated during switching from an amorphous state to a crystalline state.

5. The component as claimed in claim 4, wherein the element (1) is an OUM cell.

6. The component as claimed in claim 1, a pass transistor (8) connected into the data line (7) being inhibited or enabled by means of the element (1), wherein only one element (1) or two elements (1) coupled to one another and operated in parallel is/are provided for actuating the pass transistor (8).

7. The component as claimed in claim 6, wherein two TMR cells (2) are provided, which are driven in inverted fashion.

8. The component as claimed in claim 7, wherein the two elements (1) are two TMR cells (2) having a resistance ratio between the two state-related resistances not equal to 1:1.

9. The component as claimed in claim 1, wherein the element (1) is one of a TMR cell (2) and a OUM cell, the element having a resistance ratio between the two state-related resistances of at least 1:5.

10. The component as claimed in claim 1, wherein the switching time for changing over the resistance of the element is $\leq 5$ ns.

11. A component with a logic circuit arrangement with configurable functionality, comprising:
   a plurality of data lines (7);
   at least a portion of the data lines (7) being assigned an element (1) that can be switched between two states with different discrete resistances, by means of which element (1) the data lines (7) are enabled or inhibited depending on the switched state of the element (1),
   wherein the switching state of the element (1) is stored in nonvolatile fashion,
   wherein i) a pass transistor (8) connected into the data lines (7) is inhibited or enabled by means of the element (1), or ii) the element (1) itself is configured as the pass transistor that enables or inhibits the data lines (7), and
   wherein the element (1) exhibits a resistance change as a result of a phase change generated during switching from an amorphous state to a crystalline state.

12. The component as claimed in claim 11, wherein the element (1) is an OUM cell.

13. The component as claimed in claim 11, the element (1) itself being used as the pass transistor that enables or inhibits the data line (7), wherein the element (1) is connected directly into the data line and directly opens or inhibits the latter, or in that the element is connected in parallel with the data line and short-circuits the latter or behaves in transparent fashion.

14. The component as claimed in claim 13, wherein the element (1) has a resistance ratio between the two state-related resistances of at least 1:5.

15. The component as claimed in claim 11, characterized in that the switching time for changing over the resistance of the element is 5 ns.

16. The component as claimed in claim 11, characterized in that the switching time for changing over the resistance of the element is $\leq 3$ ns.

17. A component with a logic circuit arrangement with configurable functionality, comprising:
   a plurality of data lines (7);
   at least a portion of the data lines (7) being assigned two elements (1) that can be switched between two states with different discrete resistances, by means of which two elements (1) the data lines (7) are enabled or inhibited depending on the switched state of the element (1),
   wherein the switching state of the two elements (1) is stored in nonvolatile fashion,
   wherein a pass transistor (8) connected into the data lines (7) is inhibited or enabled by means of the two elements (1),
   wherein the two elements (1) are coupled to one another and operated in parallel, and
   wherein the two elements are two TMR cells (2) driven in inverted fashion.

18. The component as claimed in claim 17, wherein the two TMR cells (2) have a resistance ratio between the two state-related resistances not equal to 1:1.

* * * * *